US006873010B2

(12) United States Patent
Chidambarrao et al.

(10) Patent No.: US 6,873,010 B2
(45) Date of Patent: Mar. 29, 2005

(54) HIGH PERFORMANCE LOGIC AND HIGH DENSITY EMBEDDED DRAM WITH BORDERLESS CONTACT AND ANTISPACER

(75) Inventors: Dureseti Chidambarrao, Weston, CT (US); Omer H. Dokumaci, Wappingers Falls, NY (US); Bruce Bennett Doris, Brewster, NY (US); Oleg Gluschenkov, Wappingers Falls, NY (US); Rajarao Jammy, Wappingers Falls, NY (US); Jack Allen Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/682,430

(22) Filed: Oct. 10, 2003

(65) Prior Publication Data

US 2004/0075111 A1 Apr. 22, 2004

Related U.S. Application Data

(62) Division of application No. 10/160,540, filed on May 31, 2002, now Pat. No. 6,709,926.

(51) Int. Cl.$^7$ ................................................. H01L 29/76
(52) U.S. Cl. ........................ 257/329; 257/296; 257/330; 438/241; 438/275; 438/279
(58) Field of Search ............................. 257/296, 329, 257/330, 200, 351, 369; 438/241, 275, 279

(56) References Cited

U.S. PATENT DOCUMENTS

| | | | |
|---|---|---|---|
| 4,141,022 A | 2/1979 | Sigg et al. | |
| 5,605,861 A | 2/1997 | Appel | |
| 5,770,490 A | 6/1998 | Frenette et al. | |
| 5,882,965 A | 3/1999 | Schwalke et al. | |
| 5,937,289 A | 8/1999 | Bronner et al. | |
| 5,965,462 A | 10/1999 | Tan et al. | |
| 5,966,632 A | 10/1999 | Chen et al. | |
| 5,998,269 A | 12/1999 | Huang et al. | |
| 5,998,271 A | 12/1999 | Schwalke | |
| 6,004,837 A | 12/1999 | Gambino et al. | |
| 6,028,339 A | 2/2000 | Frenette et al. | |
| 6,087,225 A * | 7/2000 | Bronner et al. | 438/275 |
| 6,146,962 A | 11/2000 | Kalnitsky et al. | |
| 6,153,476 A * | 11/2000 | Inaba et al. | 438/275 |
| 6,190,979 B1 | 2/2001 | Radens et al. | |

(Continued)

FOREIGN PATENT DOCUMENTS

| | | |
|---|---|---|
| EP | 0929101 A1 | 7/1999 |
| JP | 2000357749 A | 12/2000 |
| JP | 2001007223 A | 1/2001 |
| WO | WO9703462 A1 | 3/1999 |

*Primary Examiner*—David Nelms
*Assistant Examiner*—Dao H. Nguyen
(74) *Attorney, Agent, or Firm*—Whitham, Curtis & Christofferson, P.C.; Joseph P. Abate

(57) ABSTRACT

An integrated circuit includes memory cells having array transistors separated by minimum lithographic feature and unsilicided metal bit lines encapsulated by a diffusion barrier while high performance logic transistors may be formed on the same chip without compromise of performance including an effective channel, silicided contacts for low source/drain contact resistance, extension and halo implants for control of short channel effects and a dual work function semiconductor gate having a high impurity concentration and correspondingly thin depletion layer thickness commensurate with state of the art gate dielectric thickness. This structure is achieved by development of thick/tall structures of differing materials using a mask or anti-spacer, preferably of an easily planarized material, and using a similar mask planarized to the height of the structures of differing materials to decouple substrate and gate implantations in the logic transistors.

3 Claims, 14 Drawing Sheets

U.S. PATENT DOCUMENTS

| | | |
|---|---|---|
| 6,200,834 B1 | 3/2001 | Bronner et al. |
| 6,235,574 B1 * | 5/2001 | Tobben et al. ............... 438/241 |
| 6,258,659 B1 | 7/2001 | Gruening et al. |
| 6,261,894 B1 | 7/2001 | Mandelman et al. |
| 6,261,924 B1 | 7/2001 | Mandelman et al. |
| 6,261,933 B1 | 7/2001 | Hakey et al. |
| 6,326,657 B1 * | 12/2001 | Ohkawa ...................... 257/296 |
| 6,448,140 B1 * | 9/2002 | Liaw ........................... 438/279 |
| 6,531,750 B2 | 3/2003 | Chan et al. |
| 6,548,871 B1 | 4/2003 | Horita et al. |
| 6,798,017 B2 * | 9/2004 | Furukawa et al. .......... 257/329 |

\* cited by examiner

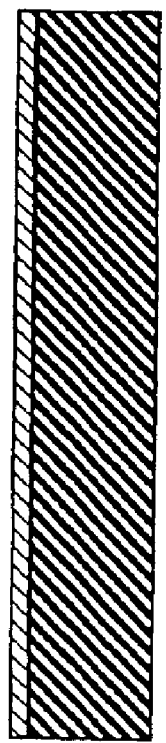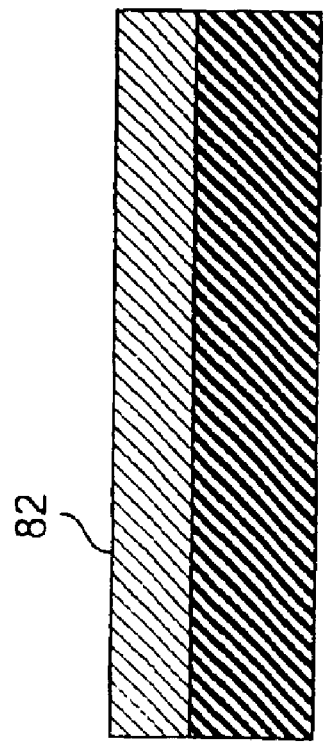
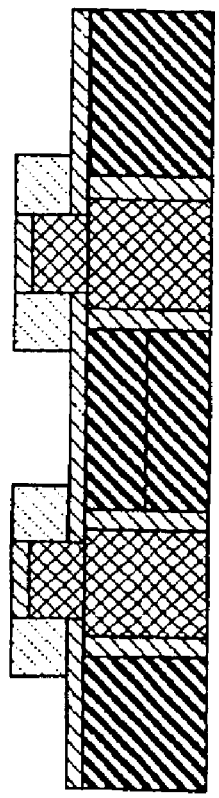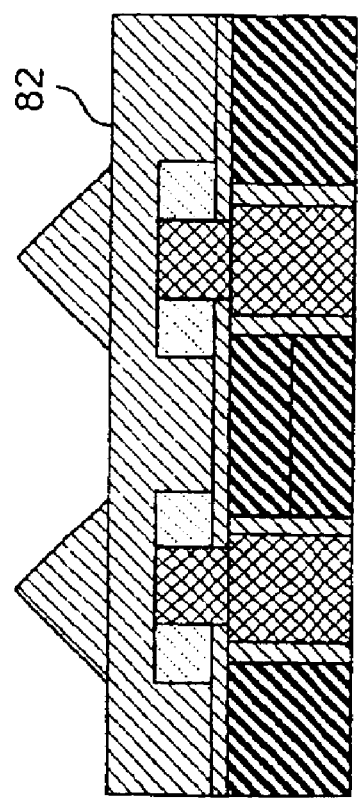
Figure 7B
Figure 8B
Figure 7A
Figure 8A

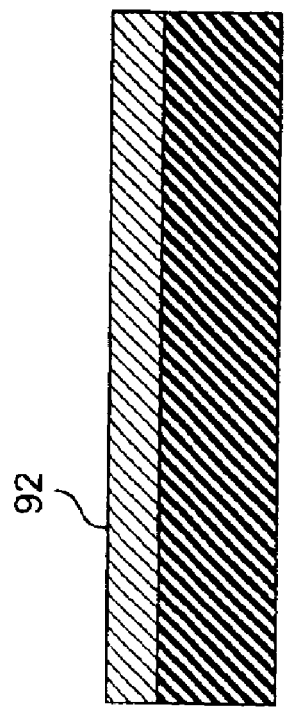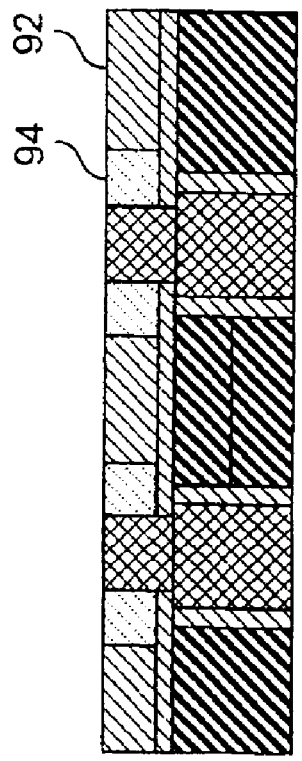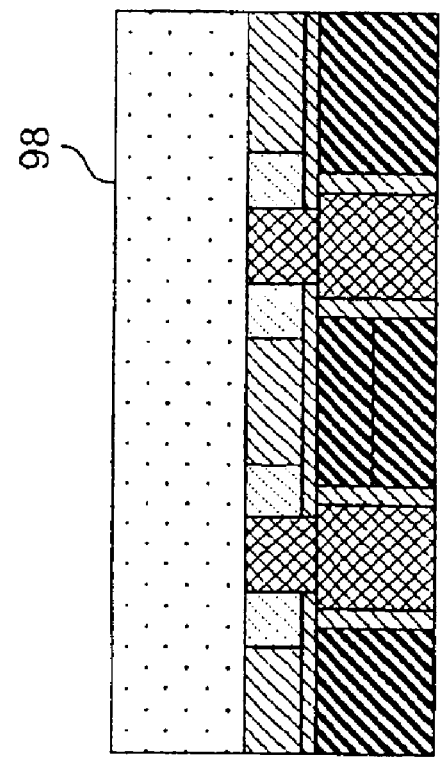

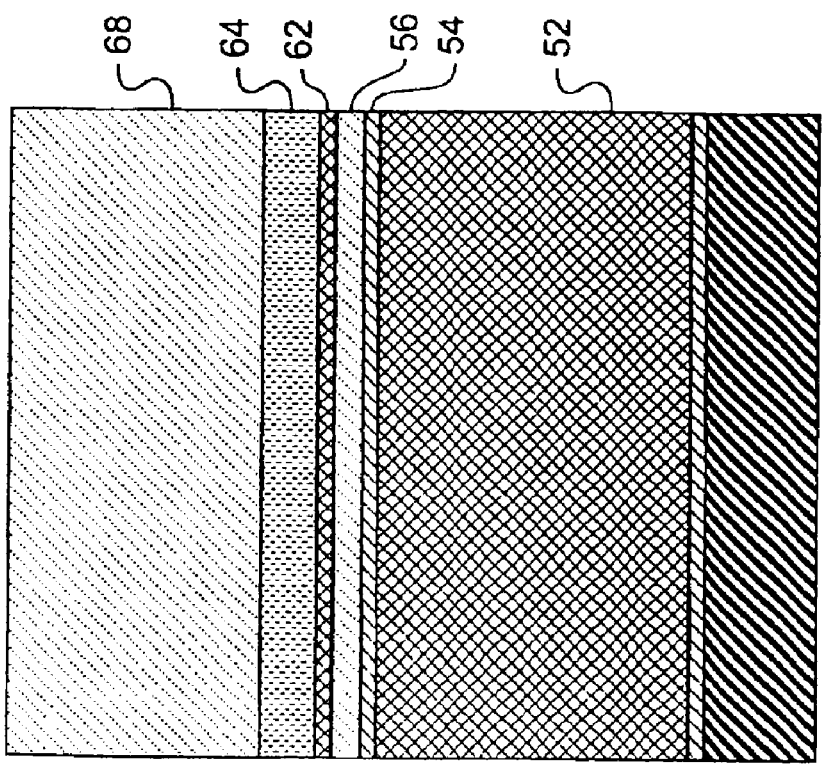
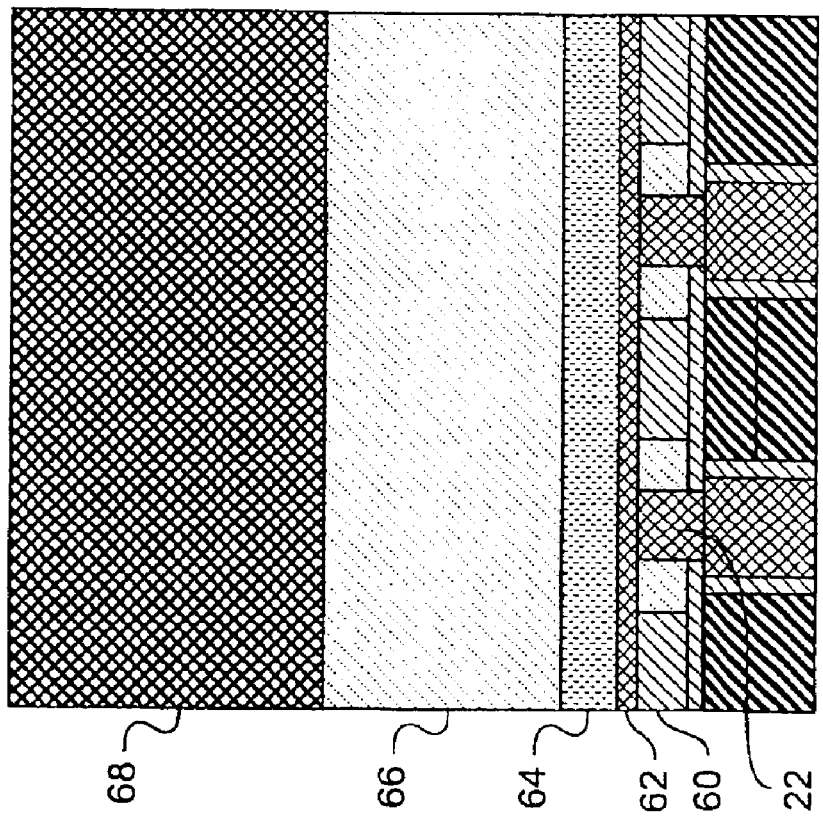
*Figure 12A*
*Figure 12B*

HIGH PERFORMANCE LOGIC AND HIGH DENSITY EMBEDDED DRAM WITH BORDERLESS CONTACT AND ANTISPACER

This application is a division of U.S. patent application Ser. No. 10/160,540, filed May 31, 2002 now U.S. Pat. No. 6,709,926.

BACKGROUND OF THE INVENTION

1. Field of the Invention

The present invention generally relates to memory cells for high integration density integrated circuits such as dynamic random access memories (DRAM) cells and integrated circuits which combine such cells with high performance logic circuit transistors on the same semiconductor chip.

2. Description of the Prior Art

Both improved performance and increased manufacturing economy can potentially be achieved by increasing integration density of elements (e.g. transistors, capacitors and the like) of integrated circuits as well as, in most cases, reduction of the size of those elements and the circuits they comprise. Therefore, there are currently substantial pressures to decrease both size and spacing of integrated circuit structures.

At least one lithographic process is generally required to establish the size and location of some of the elements on an integrated circuit chip and at any given time, several lithographic feature size regimes are in use or under development to establish processes which will provide economically acceptable manufacturing yields for a given application or market. For example, a half-micron minimum lithographic feature size may be the standard for products intended for the general public while a quarter-micron regime may be the standard for high-performance products which command a premium price and a sub-one-tenth-micron minimum feature size regime, sometimes referred to as a sub-100 nm regime may be under development to increase manufacturing yield while producing some amount of product for extremely demanding state-of-the-art applications where the need for performance that can not be otherwise obtained can offset costs of a relatively low manufacturing yield.

It should be understood that some designs for elements and circuits can be scaled from a given feature size regime to a smaller feature size regime while others cannot. For those that can be scaled in such a manner, it is customary to refer to the area of a given type of circuit or design by the number of minimum feature size areas, $F^2$ (F being the effective resolution of the system or the minimum feature dimension that can be resolved in a lithographic exposure), it requires. For example, modern DRAM cell designs generally require a minimum area of 6 to 12 $F^2$ on a chip, assuming that processes exist to carry out the fabrication of the design for a given F. At the same time, it should be recognized as a goal for a given F to be able to design and economically fabricate a given type of circuit in the same minimum number of $F^2$ areas required for a circuit having the same function at a larger minimum feature size or value of F, particularly where a given circuit design cannot be directly scaled.

At the same time, however, new structures are being developed to reduce the minimum area required for a given type of circuit. For example, to reduce a DRAM cell area from about $12F^2$ to $6F^2$, the transistor gates (there being one transistor and one capacitor per cell in current designs and DRAM cells generally being produced at extremely high density) must be spaced apart by less than 2F and generally by only 1F. Due to such short distances, mask alignment cannot be used to form a contact between gates. Therefore, recently developed so-called borderless contacts are generally employed to make a contact between the gates. In general, borderless contacts exploit differential etch rate techniques in an area that overlaps two materials (often $SiO_2$ and SiN) in order to form a sub-lithographic size structure extending orthogonally to the chip surface.

Another new structure that enables a small DRAM cell size is a non-planar (vertical) access transistor. In this structure, the access transistor is formed on the walls of a trench or pillar. Such a transistor can have a gate length larger than 1F while maintaining a small wafer surface footprint. Therefore, the cell size scaling is effectively decoupled from the transistor channel length. This feature is important because of the existence of a lower channel length limit imposed by the charge retention requirement of memory cells in the array.

In DRAM circuits the retention of the stored charge can be affected by transistor leakage and capacitor size. That is, as capacitor size is reduced, the amount of stored charge representing stored data is correspondingly reduced and leakage through the transistor when the off-resistance is reduced may corrupt data unless refresh rates are increased; increasing, for example, the power consumption.

Non-planar transistors and borderless contacts are often combined in the same cell for greater density and charge retention characteristics in memory designs currently of interest. However, developing transistors at such small sizes and spacings and the use of techniques and structures such as borderless contacts and non-planar transistors generally precludes the development of other structures that may be important to transistor switching performance even though reduced transistor performance may be tolerable in some applications.

High performance logic transistors exhibit very high switching speed. Several techniques have been developed for increasing their performance but many be incompatible with high density memory structures described above. In order to achieve a very fast switching speed, logic transistors (e.g. transistors used in logic switching applications, as distinguished from isolation-type access transistors such as is employed in DRAM arrays) have a very thin gate dielectric, a heavily doped dual work function gate, carefully engineered source and drain impurity implantation profiles and a sub-lithographic (typically about 0.7–0.5F) trimmed gate.

Even with currently known designs which can be fabricated at sub-100 nm feature sizes, array transistors and logic transistors have much different fabrication requirements which have been considered as incompatible at least to the extent of requiring compromise of performance and/or operating margins to form both types of transistors on a single chip, if possible at all. Specifically, borderless contacts of array transistors require a thick insulator (generally nitride) while similar insulating materials are used as sidewalls only for controlling extension and possibly halo implants and the like. Similarly, array transistors and logic transistors require different sheet resistance of their gates. In the array, where there are long word lines, the gate sheet resistances should be minimized by creating a highly conductive metal layer on top of the gate electrode. On the other hand, relatively short logic gates use a silicide layer as their gate conductors. Further, the silicidation process results in a low source and drain contact resistance which is necessary in logic transistors to increase their switching speed.

Another area of incompatibility between array and logic transistor designs is spacer geometry even though spacers for array and logic transistors may be of the same material. Logic transistors imply spacers at the sides of the gates to control the location of implant and/or halo implants which control short channel effects and to separate the extension/ halo implants from the source/drain implants (which are generally of different energy, energy spread and concentration). A single spacer thickness may suffice for NMOS transistors which use an impurity with relatively low diffusivity at high temperatures (e.g. arsenic) which limits the diffusion rate during subsequent heat treatment. However, to obtain desired dopant concentration profiles in PMOS transistors which employ an impurity with relatively high diffusivity at high temperatures (e.g. boron) and higher diffusion rates, at least two spacers, often of differing thickness, are generally required. Even more spacers may be necessary for both NMOS and PMOS transistors, depending upon desired electrical chartacteristics. On the other hand, as alluded to above, for array transistors located with a 1F separation, a total sidewall spacer thickness well below 0.5F is required in order to form a borderless contact therebetween.

Moreover, the silicidation alluded to above and required by the logic transistors for high performance requires metal deposition at a late stage in the fabrication process while the metal is already in place for the array transistors. Heat treatment after metal deposition which is necessary to the silicidation process can also destroy array transistors which are spaced from each other by a distance comparable the the silicidation depth (e.g. where metal diffuses into silicon and alloys therewith).

In yet another area of incompatibility is the electrical thickness (physical thickness multiplied by the ratio of the dielectric constant of silicon oxide to that of the gate dielectric) of the gate dielectric. High speed logic transistors have an extremely thin gate dielectric which is often made from a high dielectric constant (high-k) material as compared with thermal silicon oxide. Such high-k material can be a nitrided silicon oxide, silicon nitride, various metal oxides (e.g. aluminum oxide, hafnium oxide, zirconium oxide, and the like), certain insulating metal nitrides (e.g. aluminum nitride) and their various combinations (e.g. laminates and composites). On the other hand, memory access transistors have a relatively thick gate dielectric/insulator (typically a thermal silicon oxide) in order to minimize leakage in the "off" state.

Furthermore, the gate depletion effect in polycrystalline silicon gates becomes very important for ultra-thin gate insulators of logic transistors. Indeed, if the gate electrode doping level is around $10^{20}/cm^3$, the depletion layer in a doped gate electrode is approximately 10–11 Angstroms. This would effectively thicken the ultra-thin gate dielectric by 3–4 Angstroms of equivalent oxide thickness (EOT). With the state of the art gate insulator of 12–15 Angstroms, the depletion layer can degrade the performance by 20%–30%. Therefore, it is highly desirable to increase the gate electrode doping of logic transistors to the range of $5 \times 10^{20}/cm^3$ to $2 \times 10^{21}/cm^3$. Such high doping levels are not required (and, hence, not used) in the memory access transistors.

In summary, there are numerous points of incompatibility between array transistor structures and logic transistors which prevent or greatly complicate the development of high performance of logic transistors and extremely close spacing between array transistors on the same chip. At the present state of the art where sub-100 nm feature size regimes are being developed, the trade-off is so severe that one or the other must be substantially sacrificed; limiting the memory capacity of a chip or severely reducing performance of logic switching transistors. Additionally, the process complexity must not be increased to the point of compromising manufacturing yield or economy in order to produce such effects while supporting relatively high volume production.

SUMMARY OF THE INVENTION

It is therefore an object of the present invention to provide a high capacity, high performance memory array which may be embedded in a circuit including very high performance logic transistors consistent with limited process complexity and high manufacturing yield.

It is a further object of the invention to provide a manufacturing technique which decouples the production of desirable design features of array transistors and high performance logic transistors formed on a common chip or wafer.

It is yet another object of the invention to provide a manufacturing technique by which silicidation can be masked and thus controlled in array transistors of a memory array when integrated with other structures requiring late-process formation of silicide.

In order to accomplish these and other objects of the invention, a semiconductor integrated circuit having array transistors in memory cells and logic transistors is provided wherein the array transistors have a spacing of the minimum feature size, F, the memory cells having an area of $12F^2$ or less and the logic transistors have an effective channel length of 0.7F or less, an effective gate dielectric thickness of twenty Angstroms or less, a dual work function semiconductor gate with maximum depletion thickness of 1.5 Angstroms of equivalent oxide thickness in the inversion mode and a source drain contact resistance of $3 \times 10^{-8}$ or less.

In accordance with another aspect of the invention, a semiconductor integrated circuit is provided including array transistors having metal gate conductors encapsulated by a diffusion barrier including a thick cap insulator and a borderless source/drain contact at a spacer adjacent said thick cap insulator, and logic transistors having silicided contacts, extension implants and a dual work function semiconductor gate having an impurity concentration of greater than $4 \times 10^{20}$.

In accordance with a further object of the invention, a method of making an integrated circuit is provided including steps of forming a dielectric layer on a semiconductor substrate wherein the dielectric layer includes a gate dielectric region, forming a polysilicon layer on the dielectric layer and the gate dielectric region, removing the polysilicon layer in an array area of the integrated circuit, forming a plurality of layers including an insulator material layer on a remaining portion of the polysilicon layer and on portions of the gate dielectric such that recesses remain where polysilicon has been removed, forming a mask in the recesses, removing the plurality of layers and the mask to a surface of said polysilicon, patterning the polysilicon and a remaining portion of the plurality of layers, and completing the integrated circuit whereby thick layers and, later, tall structures of differing materials are formed.

BRIEF DESCRIPTION OF THE DRAWINGS

The foregoing and other objects, aspects and advantages will be better understood from the following detailed description of a preferred embodiment of the invention with reference to the drawings, in which:

FIGS. 7A, 7B, 8A, 8B, 9A, 9B, 10A, 10B, 11A, 11B, 12A and 12B are cross-sectional views of intermediate steps of fabrication of array and logic transistors in accordance with a second embodiment of the invention.

DETAILED DESCRIPTION OF A PREFERRED EMBODIMENT OF THE INVENTION

Figure 1:
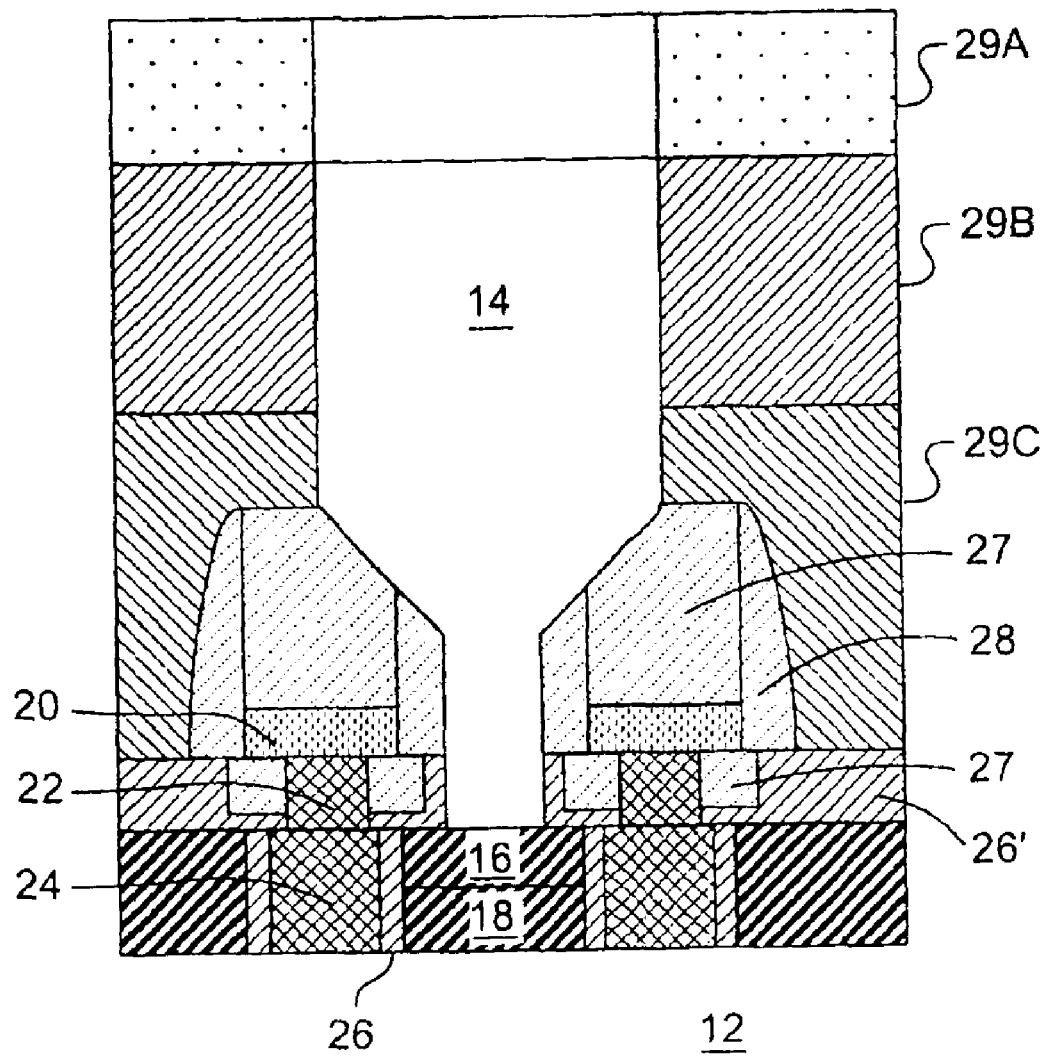
FIG. 1 is a cross-sectional view of a vertical access array transistor gate stack over which the present invention provides an improvement.
Figure 2:
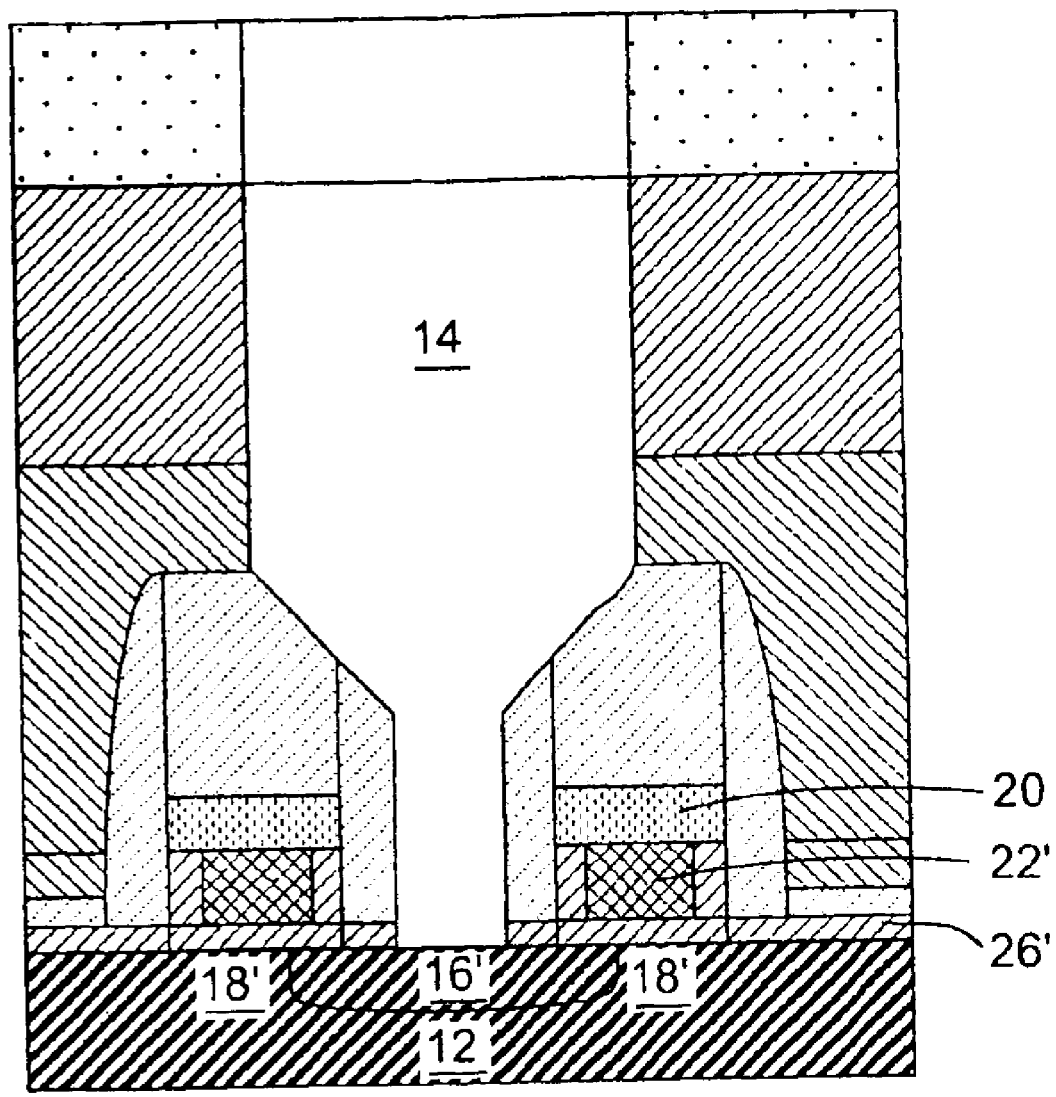
FIG. 2 is a cross-sectional view of an exemplary planar array transistor gate stack.
Figure 3:
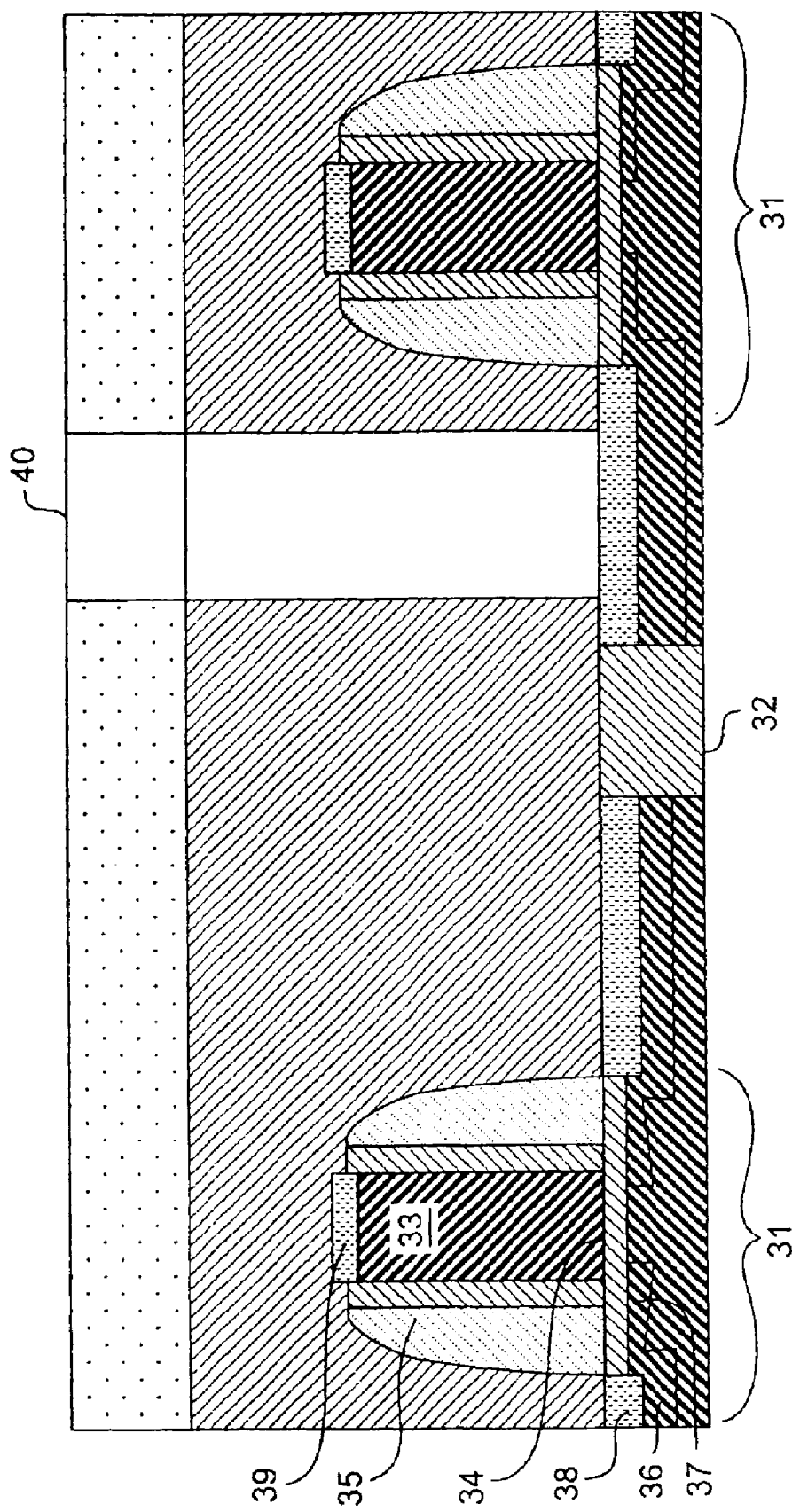
FIG. 3 is a cross-sectional view of an exemplary logic transistor gate stack.

Referring now to the drawings, and more particularly to FIGS. 1–3, there are shown cross-sectional views of a gate stack of vertical array transistors with vertical channel, conventional planar array transistors having planar channels and high speed logic transistors, respectively. As alluded to above, these types of transistors present several significant points of process incompatibility and, ideally, markedly different electrical properties which are advantageous in different functional portions of a chip, such as a high density memory and high speed logic circuits, but which are difficult to achieve on the same chip without compromise of either memory integration density or logic performance. The basic objective of the present invention is to provide for manufacture of these different types of transistors on the same chip at high yield without compromise of integration density or performance. It should be understood that FIGS. 1–3 are generalized and arranged to facilitate contrasting of the invention therewith. Therefore no portion of any of FIGS. 1–3 is admitted to be prior art in regard to the present invention.

FIGS. 1 and 2 are vertical and planar transistors, respectively. In the vertical transistor of FIG. 1, the conduction current runs vertically from the bit line contact 14, preferably of highly conductive material, through a source implant 16 and into a vertical channel formed in silicon substrate 18. The transistor channel connects the bit line contact 14 to a storage capacitor preferably formed deeper in the substrate 12 and omitted for clarity since details of the capacitor structure are not important to the practice of the invention and many suitable structures are known in the art. Techniques of forming a buried junction (often called a buried strap) is also well-understood by those skilled in the art.

The gate structure comprises gate conductor 20 (running parallel to the substrate surface and often called a word line), gate electrode polysilicon plugs 22, 24 and gate oxide 26. Isolation is provided adjacent polysilicon plug 22 by nitride 27. In the planar transistor of FIG. 2, the conduction channel runs parallel to the substrate surface from the bit line contact 14 (identical to FIG. 1), source implant/diffusion 16', through channel 18' to the drain formed in the substrate 12. The drain is connected to a storage capacitor of any suitable structure as described above but which can be formed either above or below the surface of silicon substrate 12. The gate structure is formed by gate conductor 20 (identical to FIG. 1), gate electrode polysilicon layer 22' and gate oxide layer 26'.

These transistors, whether vertical or planar, are referred to as array transistors in view of their close spacing, illustrated as 1F equal to the minimum lithographic feature size, alluded to above. The transistors of FIGS. 1 and 2 both utilize borderless contacts formed in accordance with patterned resist 29a using a nitride cap 27 and nitride spacers 28, allowing a contact via to be formed by selective etching of the nitride selectively to other materials such as thick oxide 29b and borophosphosilicate glass (BPSG) 29c. The contact via is then filled with metal or other conductive material to form borderless contact 14 to the sources of the transistors. It should also be noted that, for both process and circuit reasons, an oxide layer 26' is present on both FIG. 1 and FIG. 2 and that the transistor gate structures are substantially identical above oxide layer 26'. Because of these similarities and common structures between vertical and planar transistors, the invention as will be discussed below is applicable to both in an identical manner and a detailed discussion, as will be provided below in regard to vertical transistors such as those of FIG. 1 will be identically applicable to planar transistors such as those of FIG. 2 and the latter need not be further discussed.

Conversely, differences in the structures of FIGS. 1 and 2 are principally incidents of earlier processing of the substrate which are not important to the practice of the invention and the specifics of the structures of FIGS. 1 and 2, particularly below layer 26', should be regarded as merely exemplary of a wide variety of transistor structure designs which could be produced.

Other useful structures may already have been incorporated into the substrate. For example, the substrate may have one or more silicon-on-insulator (SOI) islands made by a masked oxygen implantation with a subsequent high temperature defect anneal. It is known in the art that such a patterned SOI substrate can be used to form a memory array in the bulk region of the wafer and high performance logic circuits can be formed on the SOI islands. The substrate may also include strained silicon or silicon germanium layers to increase the transistor "on" current.

FIG. 3 illustrates exemplary high performance transistors, referred to hereinafter as logic transistors, in collective view of types of applications in which the high performance may be relatively critical or particularly advantageous. In the context of a memory chip, such transistors would be used in a so-called support section of the chip and comprise decoders, word line drivers, sense amplifiers, buffers, I/O switching and the like. Such transistors are also representative of transistors used in processors, logic arrays and the like which may include some dynamic memory structures as, for example, large on-chip memory caches.

It should be noted that while the dimensions of the gate structures are approximately the same as those of the transistors of FIGS. 1 and 2, in contrast therewith, the spacing of transistors is much greater; allowing substantial flexibility of wiring and isolation structures 32 to be formed between the transistors. The gate structures comprise gate electrode 33, generally of highly doped polysilicon, gate insulator 34, and sidewalls 35. Source and drain impurity regions 36 are preferably provided for reduced resistance, improved conductivity and reduced short channel effects. These qualities are, in part, achieved through provision of extension and/or halo implants, collectively represented at 37 which are achieved by control of dimensions/thickness of sidewalls 35. For this reason and to obtain the impurity concentration profiles desired, multiple sidewalls of differing thicknesses are often employed. Source and drain electrode connections 38 and gate connections 39 are provided to minimize contact and sheet resistance, generally through forming additional metal silicide layers after substantial completion of the transistors.

Figure 4B:
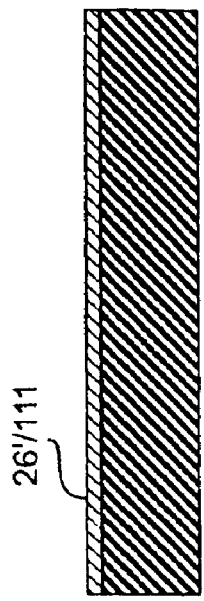
FIGS. 4A and 4B are cross-sectional views of an early stage in the manufacture of an array transistor and a logic transistor, respectively, on the same chip in accordance with the invention.
Figure 4A:
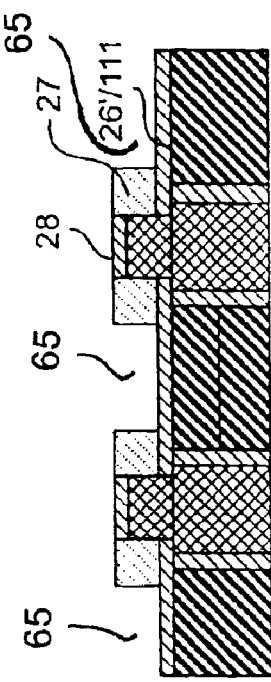

FIGS. 4A and 4B show an initial stage of the practice of the invention. Hereinafter, Figures having an "A" designation will illustrate array transistors while Figures having a "B" designation will illustrate logic transistors (corresponding, respectively, in the context of a memory chip, to the memory cell array area and the support section). It is to be understood that substrate 12 is common to both "A" and "B" Figures which illustrate different array and logic regions of a single chip or wafer, respectively. It is also to be noted that while the logic and array portions of the chip may have substantially differing heights above the substrate during different portions of the processing which will be described below and which is an important feature of the invention, both will be brought to the same height by the completion of the process and provide a substantially planar surface to facilitate lithographic conductor patterning to complete the chips.

From a comparison of FIG. 4A and FIG. 1, it is seen that the structure of a vertical transistor below oxide layer 26' is substantially complete while no structure of the logic transistors of FIG. 4B have yet been formed. The processing up to this point is unimportant to the practice of the invention beyond the fact of partial completion of the array transistors.

Figure 5B:
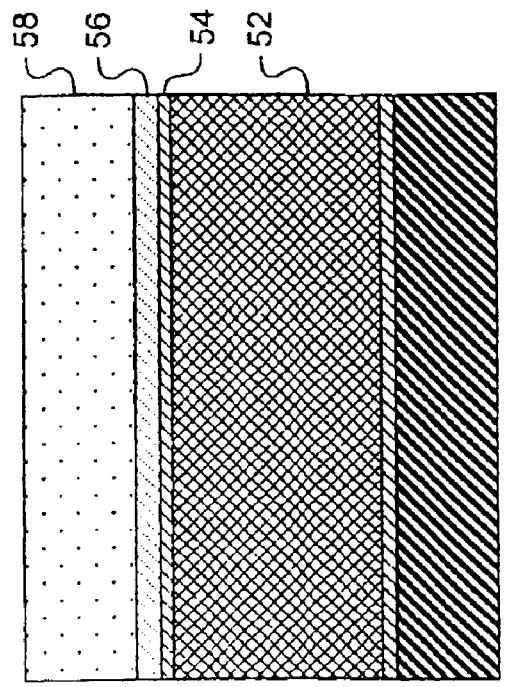
FIGS. 5A, 5B, 6A and 6B are cross-sectional views of intermediate stages of fabrication of array and logic transistors in accordance with a first embodiment of the invention.
Figure 5A:
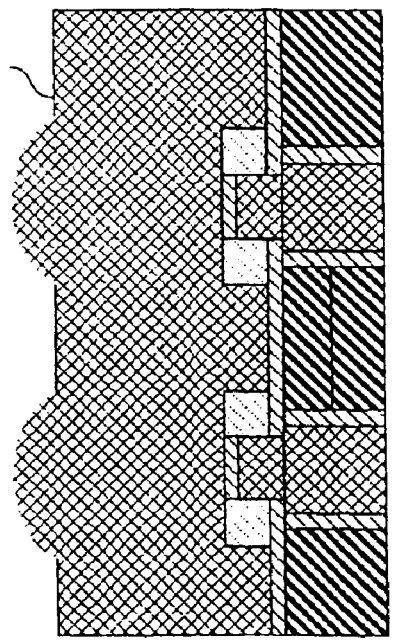

The application of the invention to the starting structure of FIG. 4 begins as illustrated in FIGS. 5A and 5B. The sacrificial oxide at 26', if provided, is stripped and gate insulator 111 is grown or deposited in substantially the same location. Gate dielectric 111 is made very thin in the logic area to satisfy a high performance requirement that its electrical thickness, sometimes referred to as equivalent oxide thickness (EOT), be less than about twenty Angstroms (including the depletion layer in the gate, itself). It should be appreciated that 26' may be removed and replaced in the array area but is not at all imvolved in the function or structure of the gates of the array transistors and thickness is not necessarily even the same or at all critical in the array area.

Formation of the gate dielectric may include the sequential formation of multiple layers of dielectric material. Processes of forming the dielectric can include thermal processes for oxidation and/or nitridization and/or deposition (e.g. of a high-K material) and may include implantation to accelerate or decelerate thermal oxidation/nitridation in selected areas.

A thick intrinsic polysilicon layer 52 is then deposited. Optionally, an oxide liner 54 and nitride liner 56 can be applied and a block-out mask 58 covering the logic areas of the chip is formed. An inexpensive medium ultraviolet (MUV) resist mask is sufficient for this purpose. Then the array can be etched to remove the nitride and oxide liners in the array region to complete the structure as shown in FIGS. 5A and 5B.

Figure 6B:
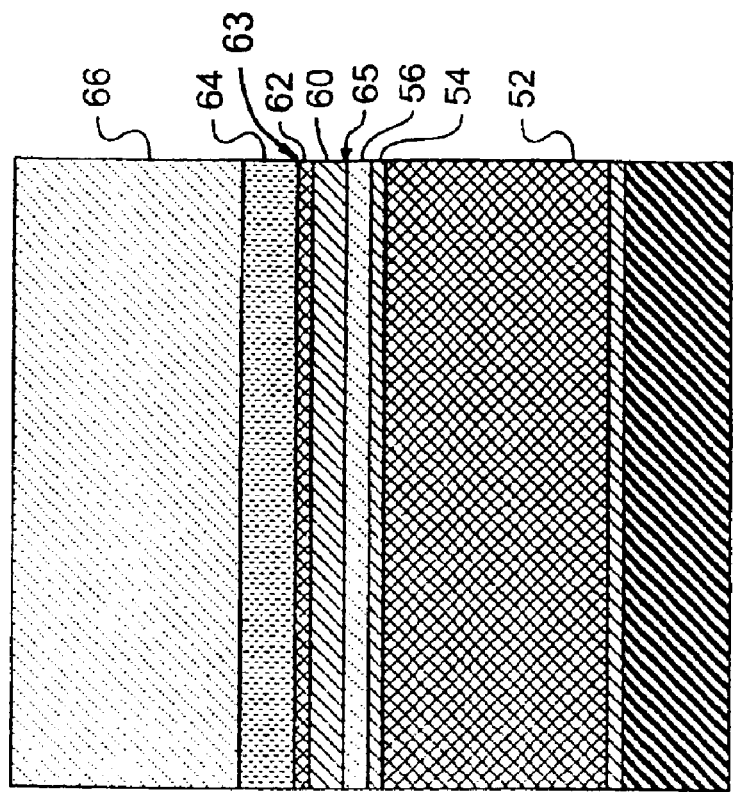
Figure 6A:
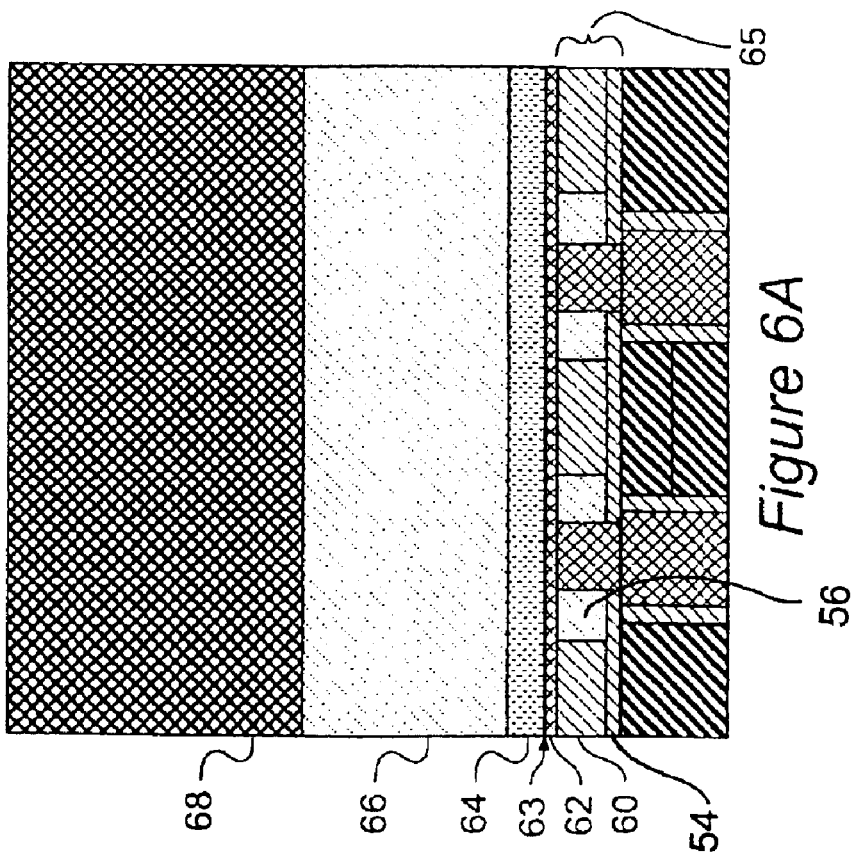

Referring now to FIG. 6, resist 58 is removed and the thick polisilicon 52 is etched from the array region, forming recesses 65, preferably by a process selective to nitride liner 56, which thus functions as a hard mask, and oxide 54. This takes the state of the array structure substantially to the state shown in FIG. 4A while layers 52, 54 and 56 remain in the logic support area as shown in FIG. 6B. In other words, at this point, the surface of the array and logic/support areas with recesses are indicated by arrow or bracket 65, respectively.

Then, a relatively thick oxide layer is deposited anisotropically, preferably by a high density plasma (HDP) process which fill recesses from the bottom up (resulting in a profile similar to that shown in FIG. 8A). This is followed by an oxide wet (HF-based) etch to recess the oxide. This removes the residue of HDP oxide and oxide cap 28 illustrated in FIG. 4A while only slightly reducing the thickness of oxide layer 60 in other regions of FIGS. 6A and 6B due to the difference in thickness achieved by the anisotropic deposition and to result in the final thickness of oxide layer 60 shown. This process is followed by an optional in-situ sputtered deposition of silicon to provide a thin silicon layer 62. While this layer is optional, it provides improved adhesion between silicon oxide and gate conductor 64. This thin silicon layer is followed by an ultra thin diffusion barrier layer 63, preferably of a conductive material, a gate conductor layer 64 and a thick nitride layer 66. In the array area, the diffusion barrier layer 63 prevents or limits silicidation of the gate conductor layer and thus preserves the low resistance of the material of the bit lines which would otherwise be raised by silicidation. It should be noted that these layers are common to both FIGS. 6A and 6B but are at different levels due to removal of thick polysilicon layer 52 from the array region as described above in accordance with hard mask 56. A self-planarizing spin-on anti-reflective coating (ARC) 68 is then applied and planarized to the silicon nitride layer 66. (The anti-reflective properties of the material are incidental and not important to the practice of the invention but numerous such materials are available and inexpensive, which deposit on surfaces anisotropically due to their propensity for wetting surfaces and are easily planarized and removed; allowing the formation of a self-aligned patterned layer without use of lithographic processes. The term anti-spacer has been applied to a mask formed of material which deposits anisotropically as opposed to isotropic deposition and anisotropic etch used to form a spacer.) Thus, the application of this spin-on layer is patterned through a maskless process.

An alternative process for deriving the structure developed to this point as discussed above in connection with FIGS. 5A, 5B and 6A, 6B will now be discussed in connection with FIGS. 7A, 7B 12A, 12B. FIGS. 7A, 7B duplicate FIGS. 4A, 4B for convenience of reference and need not be further discussed. As shown in FIGS. 8A, 8B, a thick oxide layer 82 is deposited by a preferably anisotropic deposition process such as HDP deposition for improved recess filling without excess deposition over raised surface. This layer is then planarized back to the nitride spacer 94 or array gate structure 96 as shown at surface 92 of FIGS. 9A and 9B, preferably by selectively chemical-mechanical polishing the oxide layer 82. While not particularly important to the practice of the invention, the difference in surface height of the array area and the support/logic area is due to the fact that nitride serving as a polish stop exists only in the array area and the oxide in the support/logic area is slightly (and undesirably) dished to a lower level by the polish/planarization process. Then, as shown in FIGS. 10A and 10B, a block-out mask 98 (preferably MUV) is applied and patterned and the oxide removed from the logic areas of the chip, preferably by a wet etch to prevent roughening of the silicon and to allow the silicon to function as an etch stop.

Figure 11B:
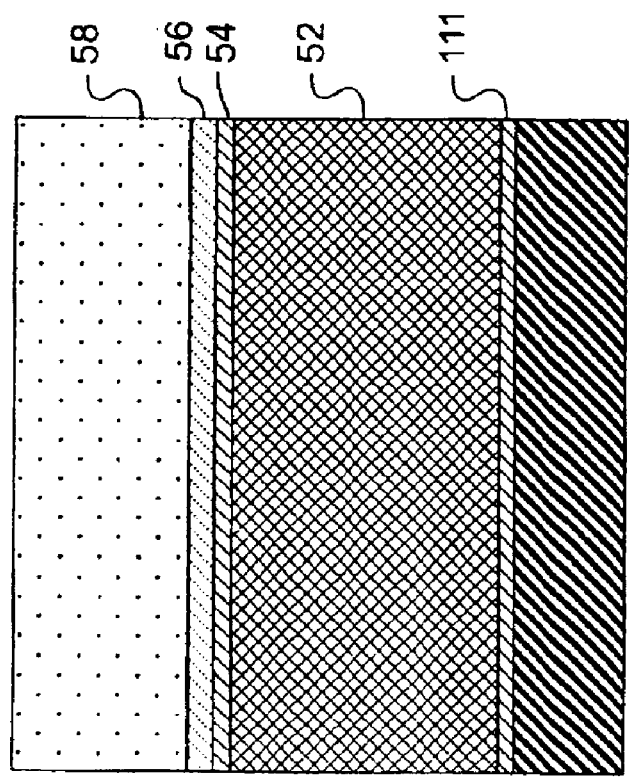
Figure 11A:
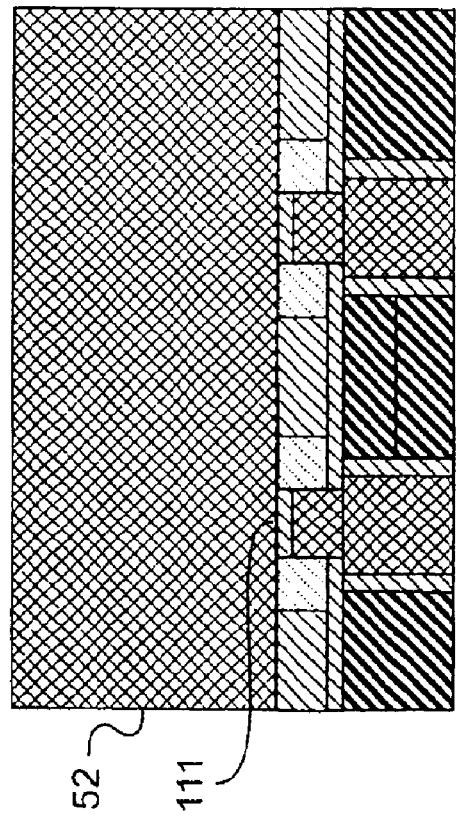

Then, to derive the structure shown in FIGS. 11A and 11B, resist 98 is stripped, and logic gate dielectric 111 is applied by any suitable technique such as those noted in the discussion of FIGS. 4A–6B. Formation of the gate dielectric in the logic areas will also generally cause a similar dielectric to be formed on the exposed polysilicon in the array areas (the thickness of which is greatly exaggerated in FIG. 11A) which must be removed later, as will be described below.

This formation of logic gate dielectric is followed by deposition of a thick layer of intrinsic polysilicon 52, followed by optional liner layers of oxide and nitride 54, 56, respectively, as discussed above in connection with FIGS. 5A and 5B. A non-critical block-out mask 58 is applied and patterned as discussed above and the liner layers 54, 56 selectively etched from the array area. This process results in substantially the same structure as that of FIG. 5 except that the top trench oxide 60 in the array area is provided and planarized in a manner which is considered to be of somewhat greater manufacturing yield at the present state of the art because of the discrete planarization step by polishing and is preferred for that reason even though more processes are required whereas, in the embodiment of FIGS. 4–6, a deposition and etch planarization scheme is employed that is somewhat more difficult to control even with HDP deposition.

To derive the structure of FIGS. 12A and 12B, the polysilicon 52 is etched away from the array region in accordance with blockout mask 58. Then the residue of gate dielectric 111 is removed from the array area. The remainder of the structure is formed as described above with reference to FIGS. 6A and 6B including the application of patterned spin-on ARC material 68. At this point, the structure of FIGS. 12A and 12B is substantially the same as that of FIGS. 6A and 6B except that layer 60 is not present in the logic section(s) of the chip. The remainder of the process in accordance with the invention is common to the above alternative embodiments and variations thereon.

Figure 13B:
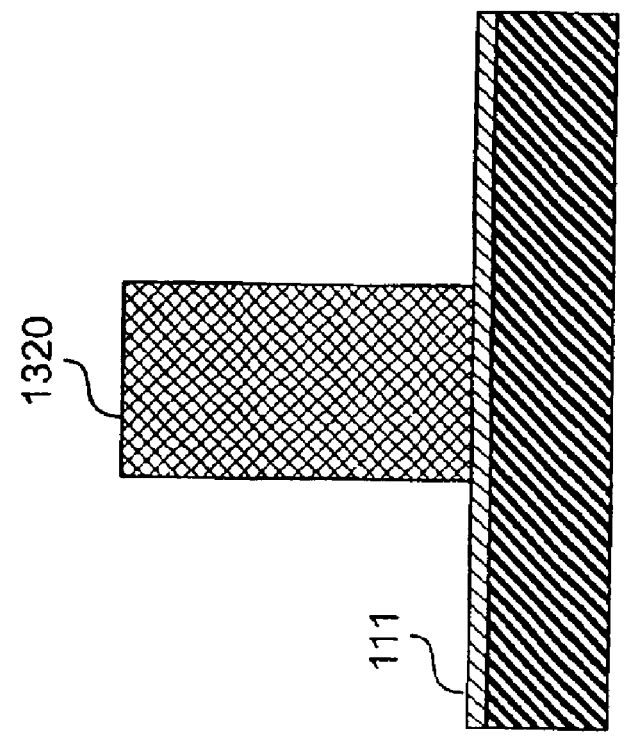
FIGS. 13A, 13B, 14A, 14B, 15A, 15B, 16A and 16B are cross-sectional views of further intermediate steps in the fabrication of array and logic transistors in accordance with either of the above alternate first and second embodiments of the invention.
Figure 13A:
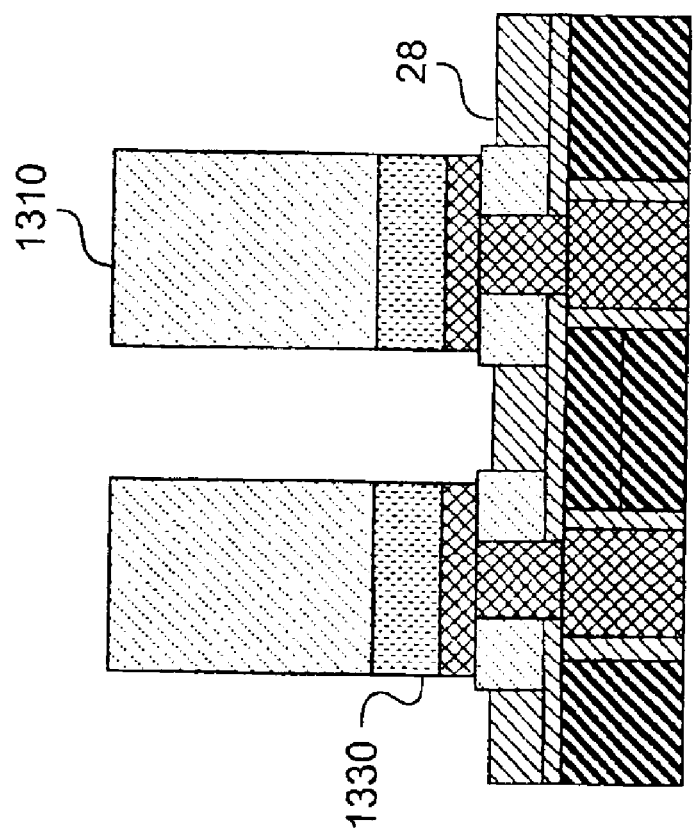

The structure illustrated in FIGS. 13A and 13B is formed by removing the nitride 66, tungsten 64, barrier layer 63 and silicon 62 from the logic area in accordance with the patterned layer 68 which can then be removed. A resist is then applied and patterned for word lines/gate connections in both the array and logic areas of the chip. By performing an etch of nitride selective to oxide, this pattern is then transferred to the thick nitride of the array area and the thin nitride of the logic area. In the array area, the nitride thus becomes a hard mask for etching of tungsten 64.

In the logic area, the nitride becomes a hard mask for etching the optional oxide layer. This oxide layer is an optional second hard mask for the logic gates. The reason for this second hard mask is its ability to be trimmed in a highly controllable manner. In order to trim logic gates (to provide sub-lithographic dimensions), the oxide layer is etched with a reactive ion etch (RIE) which is relatively selective to tungsten and then trimmed with a wet etch or another RIE process. Generally, the trim oxide etching chemistries are selected in such a manner that the trimming process is very slow and often self-limiting. Such chemistries do not attack the thick silicon nitride mask of the array. The RIE etch process may also be combined with the process to open the oxide mask. After trimming, the remaining silicon nitride in the logic areas can be removed, for example, by a short silicon nitride RIE. During the short process time, the silicon nitride of the array is not significantly affected.

Then, the array gate conductor layer 62 and diffusion barrier 63 are etched with an RIE process optimized to etch metal. Since such metal RIE processes are generally not very selective to silicon, a portion of the polysilicon will also be removed from the logic areas during the gate conductor etch. The RIE chemistry for polysilicon etching is, however, selected to be very selective to silicon oxide (e.g. of gate dielectric 111). This etch completes the definition of the array word lines and logic gates.

The gate stack etch is accomplished in four distinct RIE steps: silicon nitride etch, oxide etch/trim, metal etch, and undoped p[olysilicon etch. The absence of dissimilar polysilicon doping at this stage eases the control of the gate impurity profile in the logic areas (heavily doped n- and p-type polysilicon layers etch with different rates and may result in different gate profiles for NFETs and PFETs). The selectivity of silicon nitride etach to silicon oxide etch allows for developing silicon nitride hard masks of varying thickness.

Remaining oxide from layer 56 in the logic area can then be removed with little reduction in height of the thick nitride or thickness of oxide 28 in the array area while the operative regions of the gate dielectric 111 is masked by thick polysilicon. It is an important feature of the invention that these geometrically similar structures are formed of different materials by the process described above.

Figure 14B:
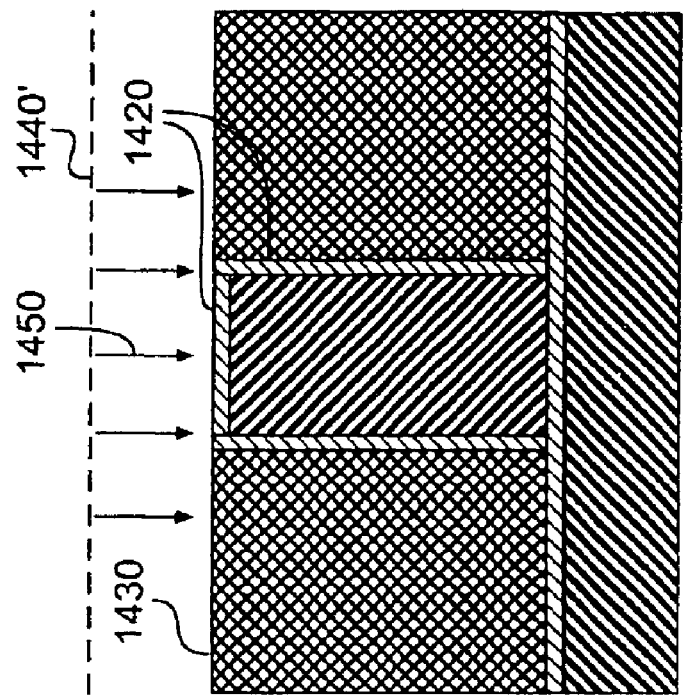
Figure 14A:
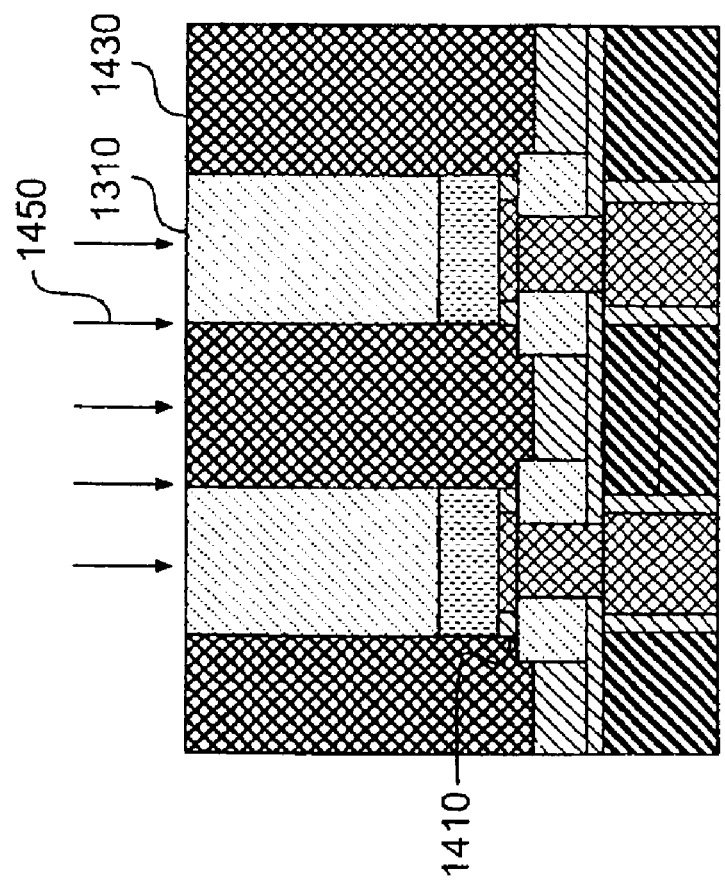

The structure of FIGS. 14A and 14B is obtained from that of FIGS. 13A and 13B by performing an optional selective sidewall oxidation to form oxide regions 1410 and oxidize the surface of the silicon mandrel 1320, as shown at 1420 of FIG. 14. Alternatively, the oxide layer may be formed by a low-temperature deposition process, preferably a chemical vapor deposition (CVD) process. Then, a spin-on ARC 1430 is applied and planarized over which a NFET block-out mask is applied to separate processing of NFETs and PFETs. Dashed line 1440/1440' is provided to illustrate the NFET mask for PFET areas and, conversely, a PFET mask in NFET areas as will be separately applied and described below.

Then the NFET gate implant 1450, preferably phosphorus, is performed with the thick nitride cap 1310 and ARC 1430 preventing impurity implantation in the array areas and the ARC 1430 and NFET mask 1440 limiting impurity implantation (I/I) to the NFET gates in the logic areas. (The order of NFET and PFET processing is of little, if any, importance to the practice of the invention.)

Impurity implantation in the gate structures of the array area is not critical (since dopants may be deposited with the polysilicon) and is suitably limited by the nitride and ARC material height/thickness. Gate implantation is, however, relatively more critical in the logic areas and the implant dose in the gates must be heavy to reduce the thickness of the depletion layer adjacent to gate dielectric 111. It should be noted that the thickness of the logic gate electrode polysilicon is selected, in part, in accordance with its ability (and that of the spin-on mask) to substantially block the gate implant from reaching the substrate. The preferred height of silicon, in the range of 1000–2000 Angstroms and preferably about 1500 Angstroms (although this thickness may be reduced if the implant energy is reduced), may be determined in a manner largely independent of other structures by the thickness of layer 52 (FIGS. 5B and 12B). The presence of the spin-on ARC material between the gates can thus adequately decouple the gate and substrate implantations even though the implantation dose is sufficiently heavy to reduce the depletion layer adjacent the gate dielectric. A similar thickness of the nitride cap and ARC material between the nitride caps in the array area is also sufficient to substantially block the implant. A similar height of about 1500 Angstroms for the array nitride caps and the logic transistor gates is preferred as a matter of process convenience but should be understood to be otherwise coincidental. The nitride caps can be made of any other height which may be preferred or required for a given design.

As alluded to above, the total equivalent oxide thickness (EOT) of the gate dielectric and the depletion layer should be held to about twenty Angstroms or less to support high performance of the logic area transistors which can be achieved in accordance with the invention. By way of comparison, state of the art gate dielectric thicknesses as small as 15 Angstroms can be achieved with marginal reliability while total equivalent oxide thickness (EOT) of under twenty Angstroms is considered necessary to support high performance in switching applications. An impurity concentration of at least $10^{20}/cm^3$ would be required to obtain a depletion layer thickness of 3.8 Angstroms marginally within this manufacturing process window while an impurity concentration four times greater would still correspond to more than a 10% effective increase in dielectric effective oxide thickness while the invention allows a gate impurity content in excess of $6 \times 10^{20}/cm^3$ (corresponding to a depletion layer of about four Angstroms and having an equivalent oxide thickness of 1.3 Angstroms). Thus, the invention supports the production of dual work function semiconductor gate with a maximum depletion thickness equivalent to 1.5 Angstroms of oxide or less in the inversion mode and a total equivalent gate dielectric thickness of twenty Angstroms of oxide or less that can be reliably manufactured.

Figure 15B:
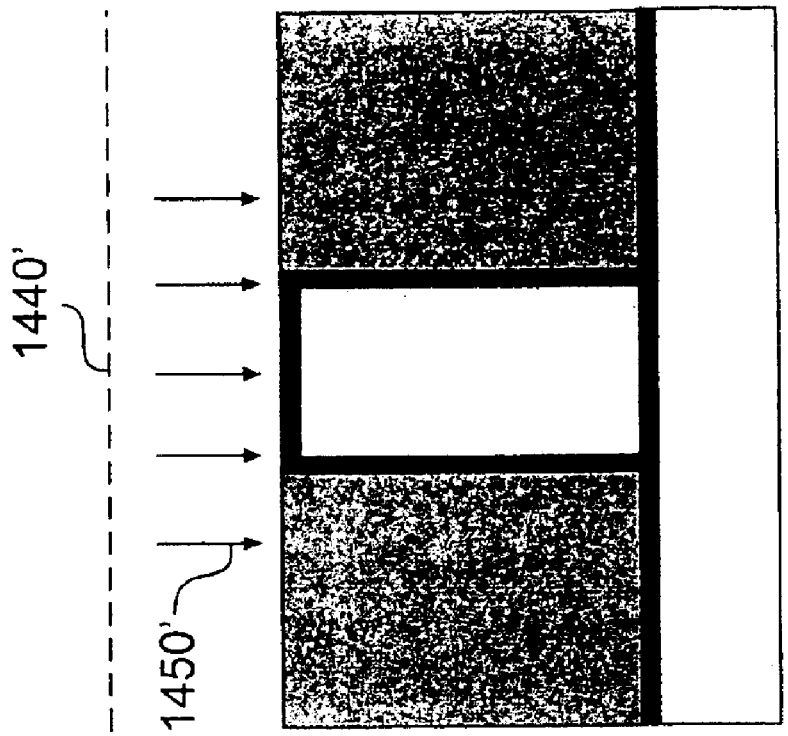
Figure 15A:
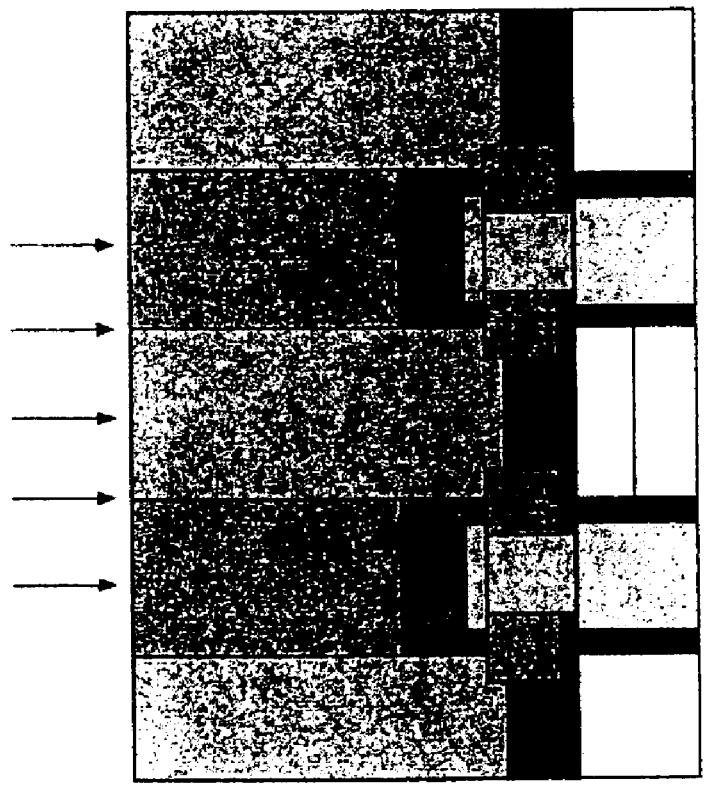

Then, the NFET mask and ARC material are removed selectively to the ARC and another spin-on ARC mask and PFET block out mask 1440' are applied, planarized and patterned, respectively, over the NFET lodic areas as shown in FIGS. 15A and 15B. The process described above is then repeated to provide the gate I/I in the PFETs of the logic area. (FIG. 15 is identical to FIG. 14 but for reference numeral 1440' denoting a different block out mask 1440 (FIG. 14B) in a different area of the chip and a different implanted impurity.) The preferred impurity implanted as illustrated at 1450' is Boron rather than phosphorus.

Figure 16B:
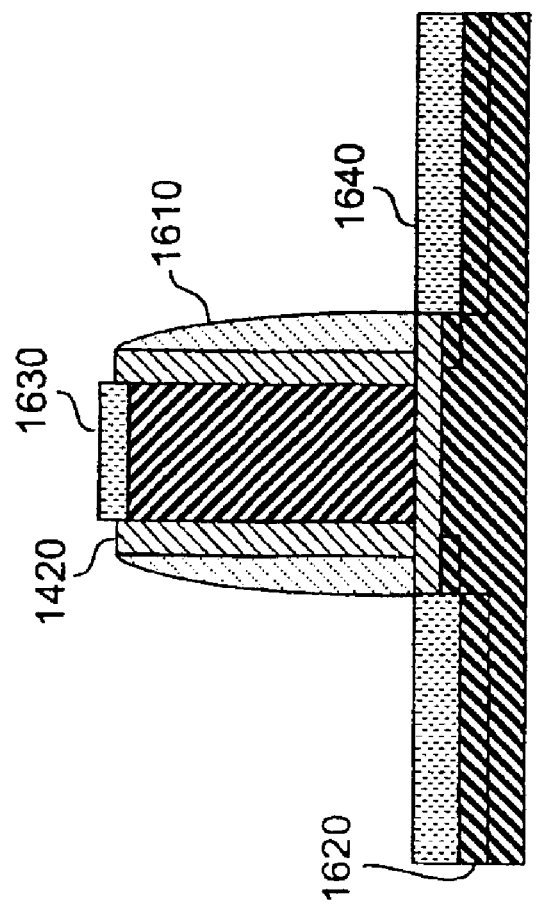
Figure 16A:
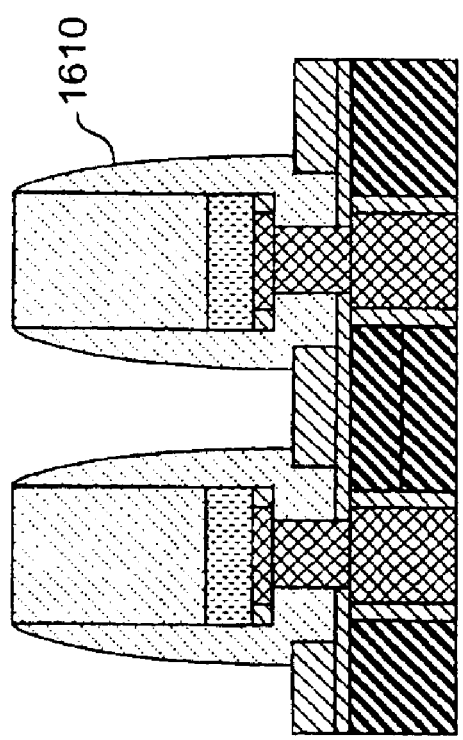

To form the structure of FIG. 16, the mask 1440/1440' and ARC 1430 are stripped and a block out mask applied over the array area as an extension implant mask. For this purpose, oxide sidewalls 1420 may be used or removed as the design may require for either or both of the NFET and PFET transistors. As alluded to above, PFET transistors, in particular, may require two or more sidewall spacers (e.g. 1610) on gate sidewalls to achieve the desired impurity profile at the ends of the conduction channel (whereas one spacer on the sidewalls may be sufficient for NFETs) and the oxide sidewall may be used as such or may be removed as the design dictates and the source/drain extension implants performed accordingly resulting in control of short channel effects corresponding to state of the art high performance logic transistors. In any case, sidewall spacer thickness to control implants sufficient to obtain desired impurity profiles can be achieved in a plurality of stages within an overall thickness of less than F/2 imposed by the requirement for borderless contacts in the array area.

At this point, spacers 1610 are formed by an isotropic deposition and anisotropic etch of nitride, as is well-understood in the art to form source/drain implant masks and the source/drain implants performed (either separately or concurrently for NFETs and PFETs). It should be noted that the spacers 1610 in the array area reach the previously formed (FIG. 4 and 94 of FIG. 9) nitride insulator structures 27 adjacent gate connections in the array area, thus encapsulating the gate wiring 1330 patterned from layer 64 (FIG. 13).

Selection of spacer thickness is connected to the diffusion property of the souce/drain implant. For a given thermal budget, the spacer thickness should be larger than the latral characteristic diffusion length of the source/drain dopant(s). In the widely practiced self-aligned transistor fabrication scheme, the source/drain dopants and the gate dopants are introduced with a single implant. Decoupling of the source/drain implant from the gate implant allows for a reduction of source/drain implant dose and selection of a wide variety of dopants. For example, Arsenic rather than phosphorus can be used as the primary NFET source/drain dopant. Accordingly, because of the difference in diffusion rate between these dopants, the spacer thickness required for a desired impurity concentration profile can be drastically reduced.

The gates of the logic transistors as well as the nitride caps 1310/1610 are thick enough to mask the substrates under the logic transistor gates during this implant 1620. The oxide on the top of the doped (FIGS. 14B, 15B) silicon mandrel 1320 is a sacrificial cap which can now be removed and gate and source/drain metallization (preferably of nickel, cobalt or similar metals or combinations thereof) applied at 1630, 1640. Silicidation can then be performed either immediately or at a later stage of processing to develop a contact resistance of less than $3 \times 10^{-8}$ Ohms/cm$^2$ substantially the same as for state of the art logic transistors. In this regard, it should be noted that gate metallization is already in place and fully encapsulated by a barrier (e.g. nitride) in the array area and the closely spaced transistors are not subject to damage by the silicidation reaction. Rapid thermal annealling (RTA) may be used for silicidation and may be partially insulated from metal in the array by the nitride and/or metals used in the array area which are less soluble at the temperatures reached. Thus silicidation is prevented in the array area to maintain the highest possible bit line conductivity. Unreacted metallization can then be etched away in the logic area.

Figure 17A:
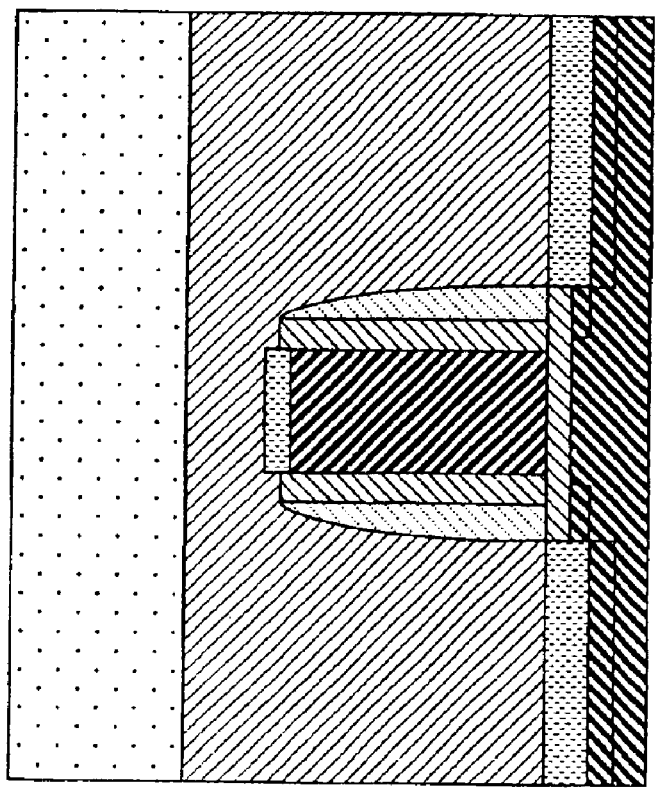
FIGS. 17A and 17B are cross-sectional views of substantially completed array and logic transistors, respectively, in accordance with the invention.
Figure 17B:
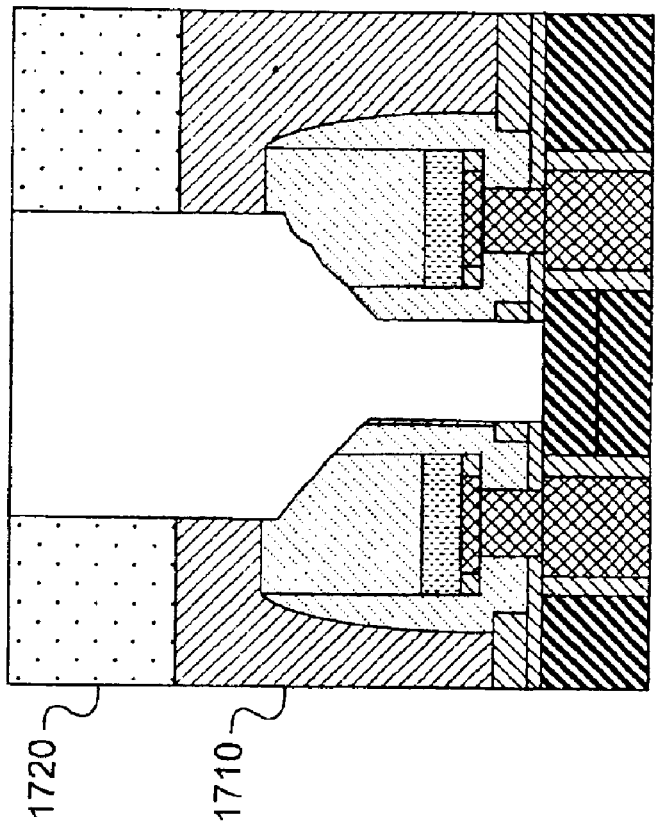

The chip may then be completed as shown in FIGS. 17A and 17B by deposition and annealling (and optional planaraization by CMP) of BPSG 1710 or other dielectrics and optional deposition of a passivation layer of tetraethylorthosilicate (TEOS) or the like 1720 and patterning of a resist to form vertical access contacts. the TEOS and BPSG are etched selectively to nitride to complete the vias (e.g. 40 of FIG. 3) to the logic area transistors and additional etching selective to nitride and oxide, in sequence, complete the borderless contact vias to the array transitors. Deposition of metal to form the contact connections completes the chip by any desired process.

To recapitulate the problems encountered in combining the transistor types of FIGS. 1, 2 and 3 as discussed above, known processes provide different thicknesses of materials, a limitation on spacer thickness in the array area imposed by the requirement for borderless contacts and the need for extension, halo and source/drain implants of a particular impurity concentration profile in the logic area with the possible further complication of the number of discrete spacers which may be needed and the requirement for silicidation in the logic transistors that may adversely affect array transistors through out-diffusion of metal or alloy or compromise bit line conductivity. High impurity concentrations are required gates of in logic transistors to reduce the effective thickness of the depletion layer in order to avoid degradation of performance advantages of thin gate dielectrics. Desired substrate impurity profiles for control of short channel effects in high performance logic transistors can be obtained without compromising memory access transistor spacing as small as the minimum feature size, F, and the area required fo a memory cell using borderless connections of $8-12F^2$ which would otherwise be increased to $18F^2$ or more. All of these potential points of incompatibility are fully solved by the provision, in accordance with the invention, of mandrels of similar height but of dissimilar materials, an oxide spacer which is optionally removable, a single thickness nitride spacer of a thickness compatible with array transistor spacing and borderless contacts and barrier encapsulation of gate metal in the array transistors.

In view of the foregoing, it is seen that the invention provides for the formation of highly incompatible logic and array transistor designs on a single chip without trade-offs in either performance or integration density. It is thus possible, by virtue of the invention to provide a high capacity DRAM embedded in a logic array or processor or, conversely, to provide the highest levels of performance in support circuitry in a high capacity DRAM. Performance of array transistors can also be enhanced and manufacturing techniques can be decoupled between highly diverse transistor designs, including control of silicidation to avoid destruction of array transistor designs by such a process substantially required for high performance logic transistors.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A semiconductor integrated circuit having array transistors in memory cells and logic transistors wherein said array transistors have a spacing of a minimum feature size, F, said memory cells having an area of $12F^2$ or less and said logic transistors having an effective channel length of 0.7F or less, an effective gate dielectric thickness of twenty Angstroms or less, a dual work function semiconductor gate with maximum depletion thickness of 1.5 Angstroms of equivalent oxide thickness in the inversion mode and a source drain contact resistance of $3 \times 10^{-8}$ or less.

2. A semiconductor integrated circuit including array transistors having metal gate conductors encapsulated by a diffusion barrier including a thick cap insulator and a borderless source/drain contact at a spacer adjacent said thick cap insulator, and logic transistors having silicided contacts, extension implants and a dual work function semiconductor gate having an impurity concentration of greater than $4 \times 10^{20}$.

3. A semiconductor integrated circuit as recited in claim 2, wherein said array transistors are separated by a minimum lithographic feature size.

* * * * *